(12) United States Patent
Huang et al.

(10) Patent No.: US 10,725,093 B2
(45) Date of Patent: Jul. 28, 2020

(54) RF TESTING APPARATUS, MOVABLE TESTING DEVICE THEREOF, AND CASE MODULE THEREOF

(71) Applicant: ADIVIC TECHNOLOGY CO., LTD, Taipei (TW)

(72) Inventors: Hsieh-Sheng Huang, Taipei (TW); Li-Chiang Hsing, New Taipei (TW)

(73) Assignee: ADIVIC TECHNOLOGY CO., LTD., Taipei (TW)

( * ) Notice: Subject to any disclaimer, the term of this patent is extended or adjusted under 35 U.S.C. 154(b) by 154 days.

(21) Appl. No.: 16/131,098

(22) Filed: Sep. 14, 2018

(65) Prior Publication Data

US 2019/0361070 A1 Nov. 28, 2019

(30) Foreign Application Priority Data

May 25, 2018 (TW) .............................. 107206910 U

(51) Int. Cl.
*G01R 31/28* (2006.01)
*G01R 1/18* (2006.01)
*G01R 31/319* (2006.01)

(52) U.S. Cl.
CPC .......... *G01R 31/2822* (2013.01); *G01R 1/18* (2013.01); *G01R 31/31905* (2013.01); *G01R 31/31914* (2013.01)

(58) Field of Classification Search
CPC .......... G01R 31/2822–2824; G01R 31/31905; G01R 1/18; H03H 1/0007
See application file for complete search history.

(56) References Cited

U.S. PATENT DOCUMENTS

| 6,201,403 | B1 * | 3/2001 | Rollin | G01R 31/002 324/750.02 |
| 10,466,291 | B2 * | 11/2019 | Mylsamy | G01R 31/002 |
| 10,483,636 | B1 * | 11/2019 | Koto | H01Q 1/38 |
| 2004/0012529 | A1 * | 1/2004 | Teshirogi | G01R 29/0821 343/702 |
| 2006/0006881 | A1 * | 1/2006 | Hernandez | G01R 29/0835 324/627 |
| 2006/0232491 | A1 * | 10/2006 | Nakamura | G01R 29/0821 343/841 |

(Continued)

*Primary Examiner* — Patrick Assouad
*Assistant Examiner* — Demetrius R Pretlow
(74) *Attorney, Agent, or Firm* — Li & Cai Intellectual Property (USA) Office

(57) ABSTRACT

A case module of a radiofrequency testing apparatus has a cable hole and a front entrance, and includes two electromagnetic shielding units respectively covering the cable hole and the front entrance. Each electromagnetic shielding unit includes a stepped structure, a cover detachably fastened to the stepped structure, a shielding structure sandwiched between the stepped structure and the cover. The stepped structures of the two electromagnetic shielding units are respectively arranged around the cable hole and the front entrance. Each of the stepped structure and the cover includes a plurality of treads and a plurality of risers staggeredly arranged with the treads, and the treads and the risers of the stepped structure respectively face those of the cover. Any two faced treads are configured to sandwich a part of the shielding structure, and any two faced risers are configured to sandwich the other part of the shielding structure.

10 Claims, 13 Drawing Sheets

(56) References Cited

U.S. PATENT DOCUMENTS

| | | | |
|---|---|---|---|
| 2007/0151760 A1* | 7/2007 | Villanella | H05K 9/0016 174/358 |
| 2007/0241761 A1* | 10/2007 | Stone, III | G01N 22/00 324/627 |
| 2010/0093285 A1* | 4/2010 | Wang | H04B 17/3912 455/67.11 |
| 2010/0283476 A1* | 11/2010 | Shen | G01R 1/0466 324/537 |
| 2011/0050267 A1* | 3/2011 | Pagani | G01R 1/07307 324/756.03 |
| 2011/0083895 A1* | 4/2011 | Cochrane | H05K 9/0015 174/384 |
| 2012/0214415 A1* | 8/2012 | Harvey | H05K 7/1425 455/41.2 |
| 2012/0268153 A1* | 10/2012 | Nickel | G01R 31/3025 324/754.31 |
| 2013/0033279 A1* | 2/2013 | Sozanski | G01R 29/0821 324/750.27 |
| 2013/0187674 A1* | 7/2013 | Rada | G01R 35/005 324/750.02 |
| 2013/0197850 A1* | 8/2013 | Yu | G01R 31/2822 702/117 |
| 2014/0184241 A1* | 7/2014 | Ho | G01R 29/0814 324/602 |
| 2015/0137829 A1* | 5/2015 | Ho | G01R 29/0821 324/627 |
| 2017/0111016 A1* | 4/2017 | Backlund | H05H 7/02 |
| 2018/0013501 A1* | 1/2018 | Wei | H01Q 1/526 |
| 2018/0109330 A1* | 4/2018 | Chang | H04B 17/0085 |
| 2019/0056439 A1* | 2/2019 | Lee | G10K 11/002 |
| 2019/0219623 A1* | 7/2019 | Varel | H04B 17/12 |
| 2020/0003834 A1* | 1/2020 | Cardalda-Garcia | G01R 31/002 |

* cited by examiner

RF TESTING APPARATUS, MOVABLE TESTING DEVICE THEREOF, AND CASE MODULE THEREOF

CROSS-REFERENCE TO RELATED PATENT APPLICATION

This application claims the benefit of priority to Taiwan Patent Application No. 107206910, filed on May 25, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a testing device, and more particularly to a radiofrequency (RF) testing apparatus, a movable testing device thereof, and a case module thereof.

BACKGROUND OF THE DISCLOSURE

Since a device under test(DUT) (e.g., an RF chip) needs to be moved into a conventional RF testing apparatus by manpower before an RF testing process is implemented, the testing efficiency of the conventional RF testing apparatus needs to be increased. Moreover, in order to get an accurate testing result for the DUT, the electromagnetic shielding effect of the conventional RF testing apparatus needs to be improved to prevent any external signal from entering into the conventional RF testing apparatus. Moreover, in order to have a better shielding performance, the conventional RF testing apparatus is formed without a hole used for organizing inner cables, so that the conventional RF testing apparatus is inconvenient use.

SUMMARY OF THE DISCLOSURE

In response to the above-referenced technical inadequacies, the present disclosure discloses a radiofrequency (RF) testing apparatus, a movable testing device thereof, and a case module thereof to effectively improve the issues associated with conventional RF testing apparatus.

In one aspect, the present disclosure provides a case module of a radiofrequency (RF) testing apparatus. The case module includes at least two electromagnetic shielding units. The RF testing apparatus has an accommodating space arranged inside thereof, a cable hole, and a front entrance, and the cable hole and the front entrance are in spatial-communication with the accommodating space. The at least two electromagnetic shielding units respectively cover the cable hole and the front entrance. Each of the at least two electromagnetic shielding units includes a stepped structure, a cover, and a shielding structure. The stepped structure includes a plurality of annular treads and a plurality of annular risers staggeredly arranged with the annular treads. The cover is detachably fastened to the stepped structure and includes a plurality of abutting treads and a plurality of abutting risers staggeredly arranged with the abutting treads. The abutting treads respectively face and are spaced apart from the annular treads, and the abutting risers respectively face and are spaced apart from the annular risers. The shielding structure includes a plurality of first isolation members and a plurality of second isolation members staggeredly arranged with the first isolation members. Each of the abutting treads and the corresponding annular tread facing each other are configured to sandwich one of the first isolation members, and contacting regions of each of the first isolation members with respect to the corresponding abutting tread and the corresponding annular tread each have a closed annular shape. Each of the abutting risers and the corresponding annular riser facing each other are configured to sandwich one of the second isolation members. The stepped structures of the at least two electromagnetic shielding units are respectively arranged around the cable hole and the front entrance.

In one aspect, the present disclosure provides a movable testing device of an RF testing apparatus, which includes a case module, an RF analytical instrument, a testing socket, and a plurality of internal transmitting cables. The case module has an accommodating space arranged inside thereof, a cable hole, and a front entrance. The cable hole and the front entrance are in spatial-communication with the accommodating space. The case module includes at least two electromagnetic shielding units respectively covering the cable hole and the front entrance. Each of the at least two electromagnetic shielding units includes a stepped structure, a cover, and a shielding structure. The stepped structure includes a plurality of annular treads and a plurality of annular risers staggeredly arranged with the annular treads. The cover detachably is fastened to the stepped structure and includes a plurality of abutting treads and a plurality of abutting risers staggeredly arranged with the abutting treads. The abutting treads respectively face and are spaced apart from the annular treads, and the abutting risers respectively face and are spaced apart from the annular risers. The shielding structure includes a plurality of first isolation members and a plurality of second isolation members staggeredly arranged with the first isolation members. Each of the abutting treads and the corresponding annular tread facing each other are configured to sandwich one of the first isolation members, and contacting regions of each of the first isolation members with respect to the corresponding abutting tread and the corresponding annular tread each have a closed annular shape. Each of the abutting risers and the corresponding annular riser facing each other are configured to sandwich one of the second isolation members. The stepped structures of the at least two electromagnetic shielding units are respectively arranged around the cable hole and the front entrance. The RF analytical instrument is detachably arranged in the accommodating space of the case module by passing through the front entrance. The testing socket is disposed on a top portion of the case module and is exposed from the case module for providing an insertion and an electrical connection to a DUT to be tested. The internal transmitting cables are arranged in the accommodating space. At least one of the internal transmitting cables has two opposite ends respectively connected to the testing socket and the RF analytical instrument.

In one aspect, the present disclosure provides an RF testing apparatus, which includes an automatic testing platform and a movable testing device. The automatic testing platform has a testing space and an insert hole in spatial-communication with the testing space. The movable testing device includes a case module, an RF analytical instrument, a testing socket, a plurality of internal transmitting cables, and a lift mechanism. The case module has an accommodating space arranged inside thereof, a cable hole, and a front entrance. The cable hole and the front entrance are in spatial-communication with the accommodating space. The case module includes at least two electromagnetic shielding units respectively covering the cable hole and the front entrance. Each of the at least two electromagnetic shielding units includes a stepped structure, a cover, and a shielding structure. The stepped structure includes a plurality of annular treads and a plurality of annular risers staggeredly arranged with the annular treads. The cover is detachably fastened to the stepped structure and includes a plurality of abutting treads and a plurality of abutting risers staggeredly arranged with the abutting treads. The abutting treads respectively face and are spaced apart from the annular treads, and the abutting risers respectively face and are spaced apart from the annular risers. The shielding structure includes a plurality of first isolation members and a plurality of second isolation members staggeredly arranged with the first isolation members. Each of the abutting treads and the corresponding annular tread facing each other are configured to sandwich one of the first isolation members, and contacting regions of each of the first isolation members with respect to the corresponding abutting tread and the corresponding annular tread each have a closed annular shape. Each of the abutting risers and the corresponding annular riser facing each other are configured to sandwich one of the second isolation members. The stepped structures of the at least two electromagnetic shielding units are respectively arranged around the cable hole and the front entrance. The RF analytical instrument is detachably arranged in the accommodating space of the case module by passing through the front entrance. The testing socket is disposed on a top portion of the case module and is exposed from the case module for providing an insertion and an electrical connection to a DUT to be tested. The internal transmitting cables are arranged in the accommodating space. At least one of the internal transmitting cables has two opposite ends respectively connected to the testing socket and the RF analytical instrument. The cable hole is arranged adjacent to the testing socket and corresponds in position to the internal transmitting cables. The lift mechanism is fastened to a bottom portion of the case module and is configured to raise or lower the case module. When the movable testing device is moved toward the automatic testing platform so that the testing socket is arranged under the insert hole, the lift mechanism is configured to move the case module for moving the testing socket into the testing space through the insert hole.

Therefore, the case module, the movable testing device, and the RF testing apparatus of the present disclosure each can be provided with a cable hole (that is preferably arranged corresponding in position to the testing socket and the internal transmitting cables), so that the inner components (e.g., the internal transmitting cables) arranged in the case module can be organized through the cable hole. Moreover, the cable hole and the front entrance of the cable module each can be shielded (or sealed) by one electromagnetic shielding unit, and an external electromagnetic signal outside of the movable testing device (or the case module) can be blocked from entering into the accommodating space through the cable hole and the front entrance, so that the cable hole does not affect the electromagnetic shielding performance.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

Preferred embodiment of the invention, illustrative of the best mode in which applicant has contemplated applying the principles, are set forth in the following description and are shown in the drawings and are particularly and distinctly pointed out and set forth in the appended claims.

DETAILED DESCRIPTION OF THE EXEMPLARY EMBODIMENTS

Figure 1:
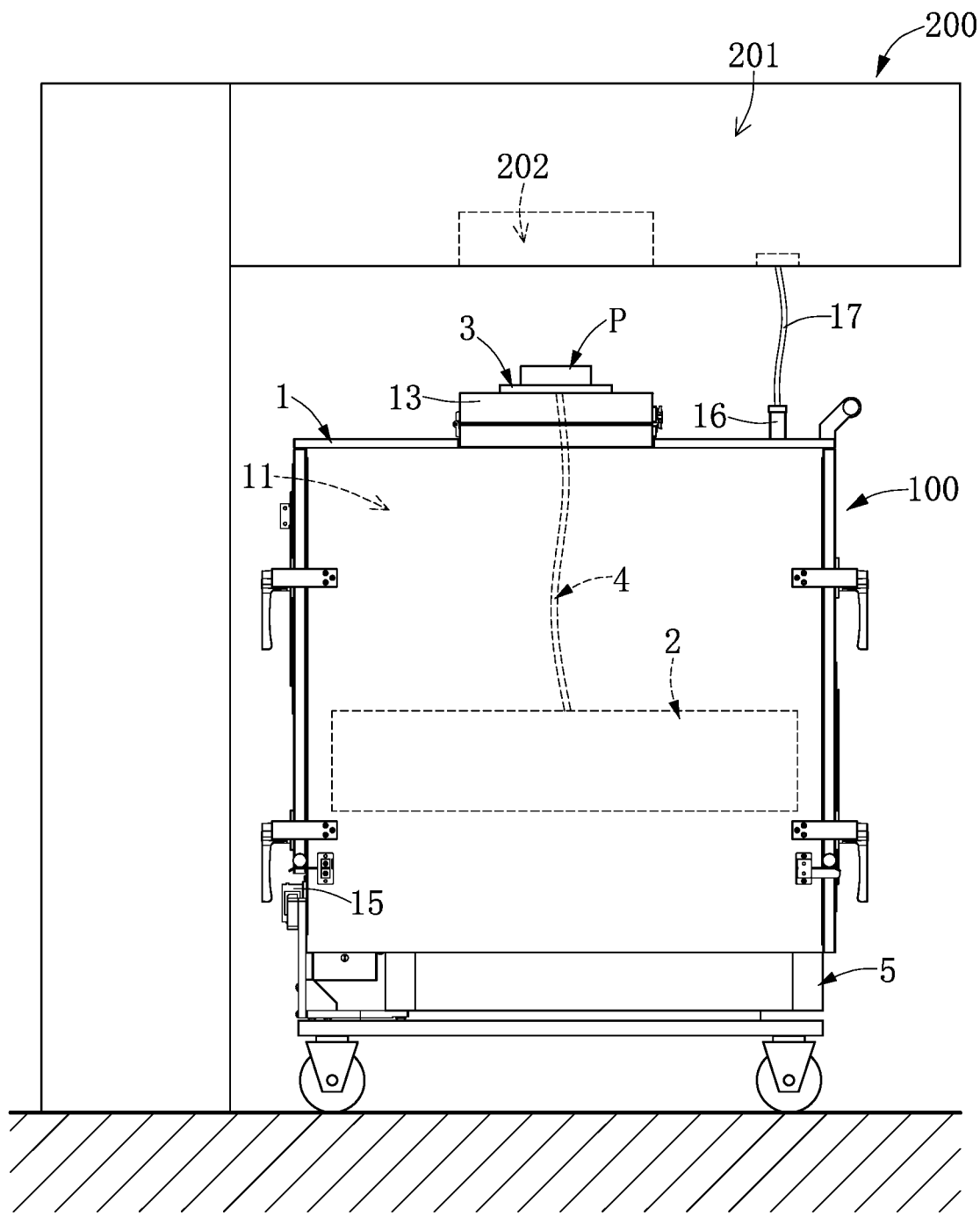
FIG. 1 is a planar view of a radiofrequency (RF) testing apparatus according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
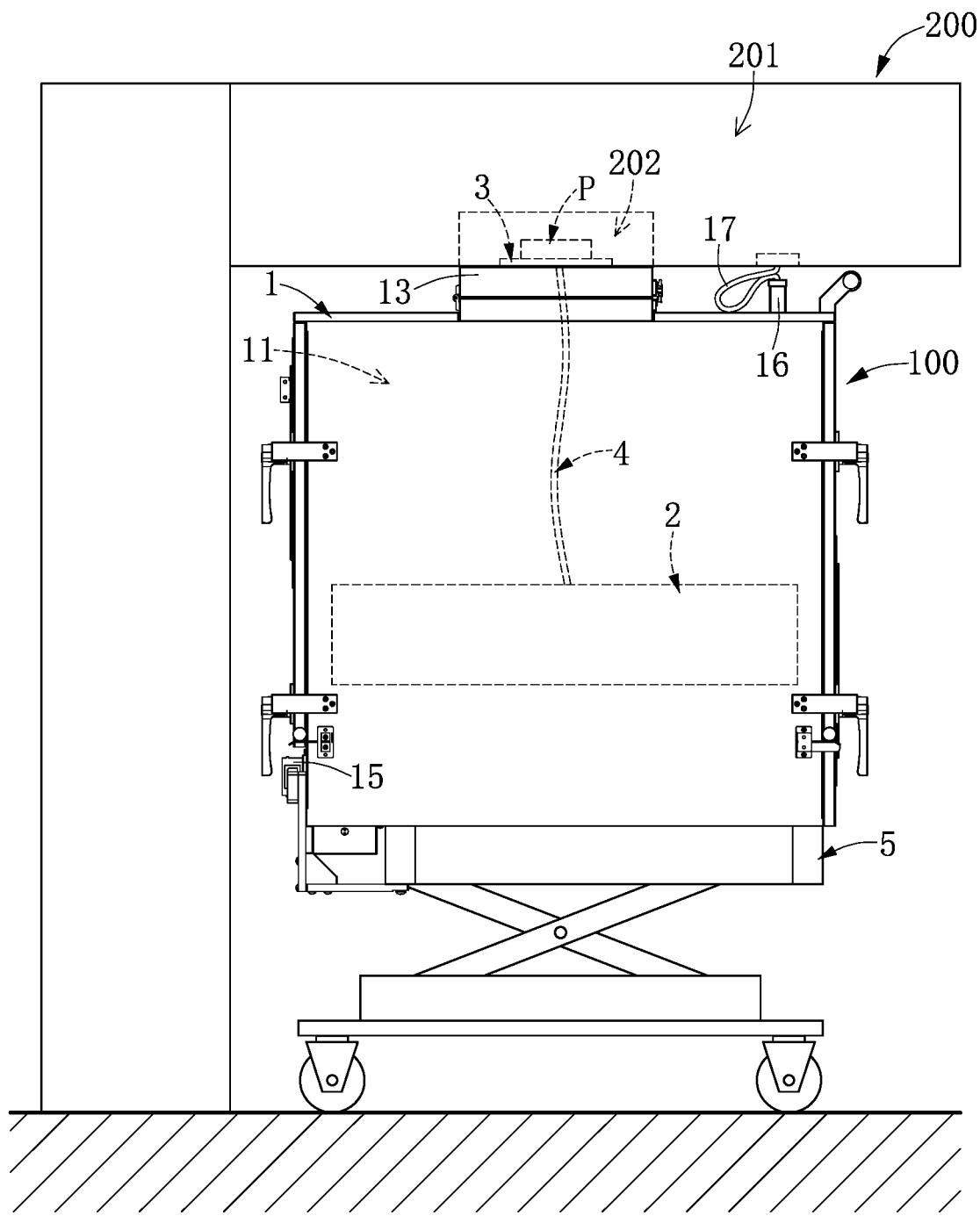
FIG. 2 is another planar view of the RF testing apparatus according to the embodiment of the present disclosure.

Referring to FIG. 1 to FIG. 13, an embodiment of the present disclosure provides a radiofrequency (RF) testing apparatus 1000. As shown in FIG. 1 and FIG. 2, the RF testing apparatus 1000 includes an automatic testing platform 200 and a movable testing device 100 cooperated with the automatic testing platform 200. The automatic testing platform 200 has a testing space 201 and an insert hole 202 in spatial-communication with the testing space 201. The movable testing device 100 can move a DUT P (i.e., an RF chip) into the testing space 201 through the insert hole 202 for implementing an RF test to the DUT P.

It should be noted that the movable testing device 100 in the present embodiment is cooperated with the automatic testing platform 200, but the movable testing device 100 in the present disclosure is not limited thereto. For example, in other embodiments of the present disclosure, the movable testing device 100 can be independently sold or be cooperated with other devices different from the automatic testing platform 200.

As shown in FIG. 1 and FIG. 2, the movable testing device 100 includes a case module 1, an RF analytical instrument 2 detachably arranged in the case module 1, a testing socket 3 fastened to the case module 1 and exposed from the case module 1, a plurality of internal transmitting cables 4 electrically connecting the RF analytical instrument 2 and the testing socket 3, and a lift mechanism 5 fastened to a bottom portion of the case module 1.

The lift mechanism 5 is configured to raise or lower the case module 1, and the lift mechanism 5 includes a plurality of rollers (not labeled) arranged on a bottom thereof. The lift mechanism 5 in the present embodiment is a hydraulic lift trolley, but the present disclosure is not limited thereto. Accordingly, when the movable testing device 100 is moved toward the automatic testing platform 200 by the rollers of the lift mechanism 5 so that the testing socket 3 is under the insert hole 202, the lift mechanism 5 is configured to move the testing socket 3 to enter into the testing space 201 through the insert hole 202.

It should be noted that the case module 1 in the present embodiment is cooperated with the above components of the movable testing device 100, but the case module 1 in the present disclosure is not limited thereto. For example, in other embodiments of the present disclosure, the case module 1 can be independently sold or be cooperated with other components. Moreover, the following description discloses the structure and connection relationships of each component of the movable testing device 100.

As shown in FIG. 3 to FIG. 6, the case module 1 has an accommodating space 11 arranged inside thereof, and the case module 1 includes a case 12, three electromagnetic shielding units 13, two honeycomb electromagnetic shielding members 14, a power supply 15, at least one external connector 16, and an external transmitting cable 17 (as shown in FIG. 1). The following description discloses the structure and connection relationships of each component of the case module 1.

Figure 5:
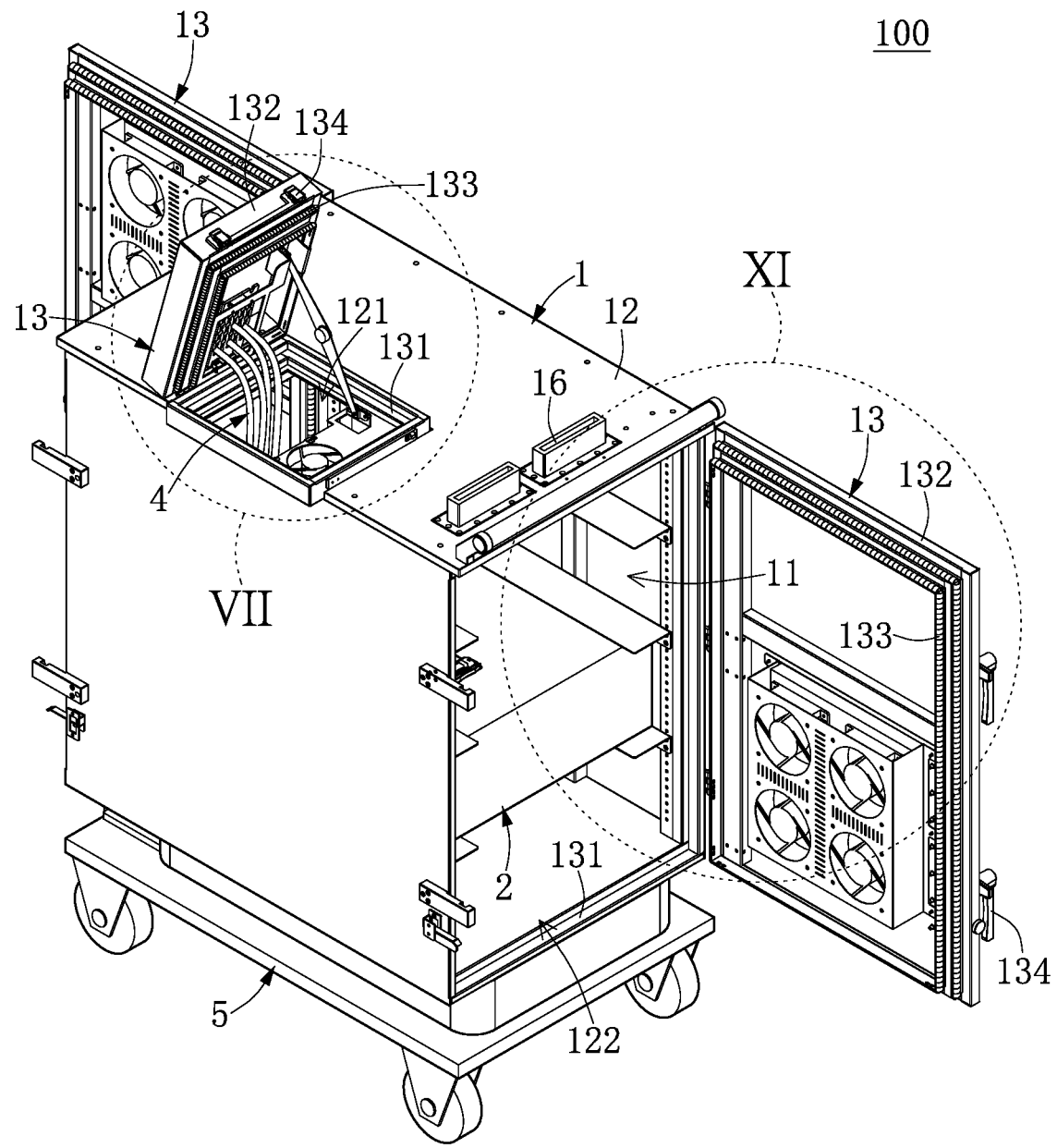
FIG. 5 is another perspective view of the movable testing device according to the embodiment of the present disclosure.
Figure 6:
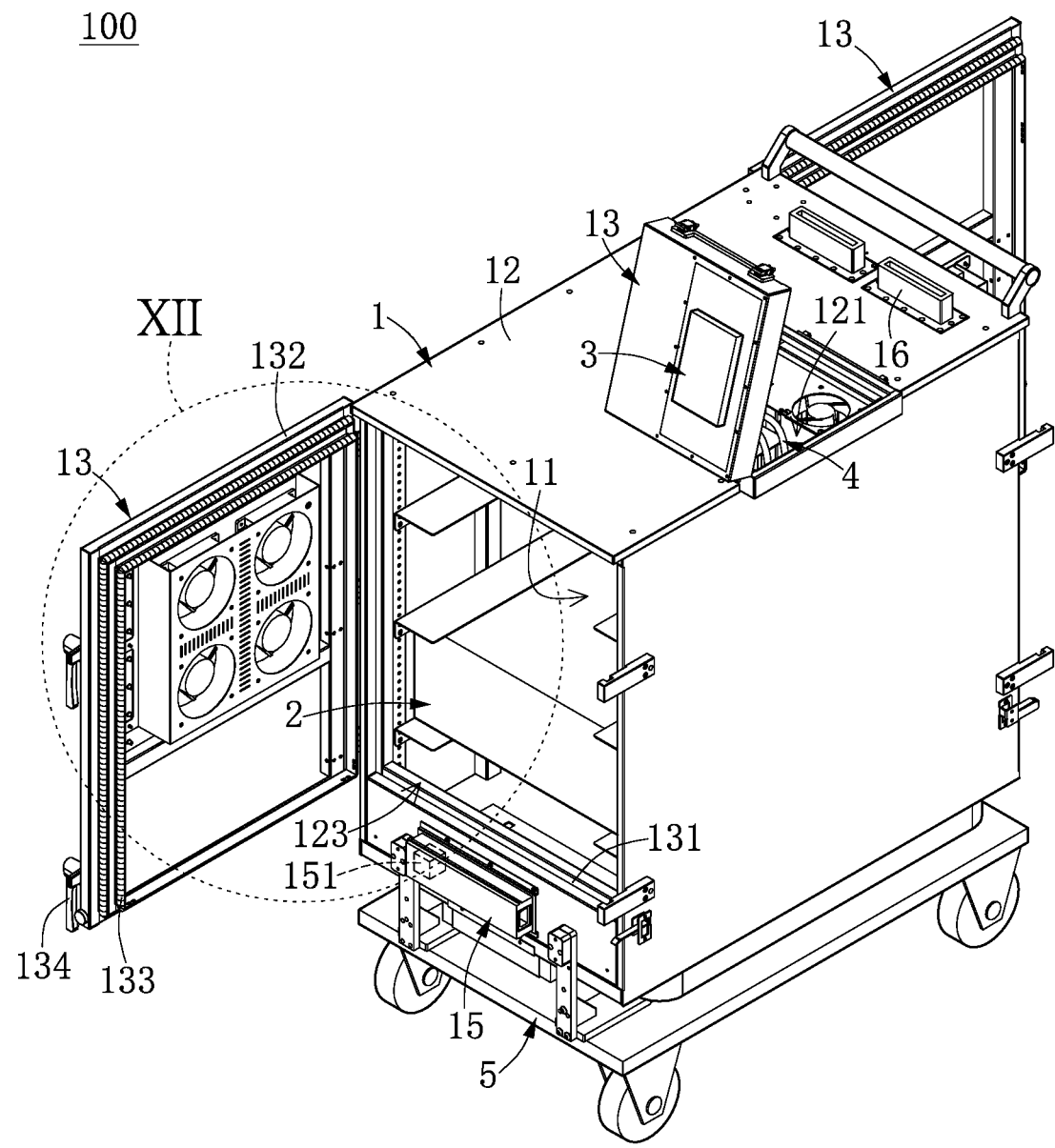
FIG. 6 is a perspective view showing the movable testing device of FIG. 5 from another angle of view.

As shown in FIG. 5 and FIG. 6, the case 12 in the present embodiment is substantially a hollow cuboid and is made of a metal material, but the present disclosure is not limited thereto. The case 12 has a cable hole 121 arranged on a top surface thereof and in spatial-communication with the accommodating space 11. The case 12 has a front entrance 122 and a rear entrance 123 respectively arranged on two opposite lateral surfaces thereof, and the front entrance 122 and the rear entrance 123 are in spatial-communication with the accommodating space 11. The three electromagnetic shielding units 13 respectively cover (or seal) the cable hole 121, the front entrance 122, and the rear entrance 123.

It should be noted that the case module 1 in the present embodiment is formed with the cable hole 121, the front entrance 122, and the rear entrance 123, and the case module 1 is provided with the three electromagnetic shielding units 13 respectively corresponding in position to the cable hole 121, the front entrance 122, and the rear entrance 123, but the present disclosure is not limited thereto. For example, in other embodiments of the present disclosure, the case module 1 can be formed without the rear entrance 123, and the case module 1 includes at least two electromagnetic shielding units 13 for respectively covering (or sealing) the cable hole 121 and the front entrance 122. In addition, the other components of the case module 1 can be adjusted or changed according to design requirements.

As shown in FIG. 5 and FIG. 6, as the electromagnetic shielding units 13 of the present embodiment are of the same or similar structure (e.g., two of the electromagnetic shielding units 13 corresponding in position to the rear entrance 123 and the front entrance 122 are of the same structure, and each are similar to the other electromagnetic shielding unit 13), the following description discloses the structure of just one of the electromagnetic shielding units 13 for the sake of brevity.

Figure 7:
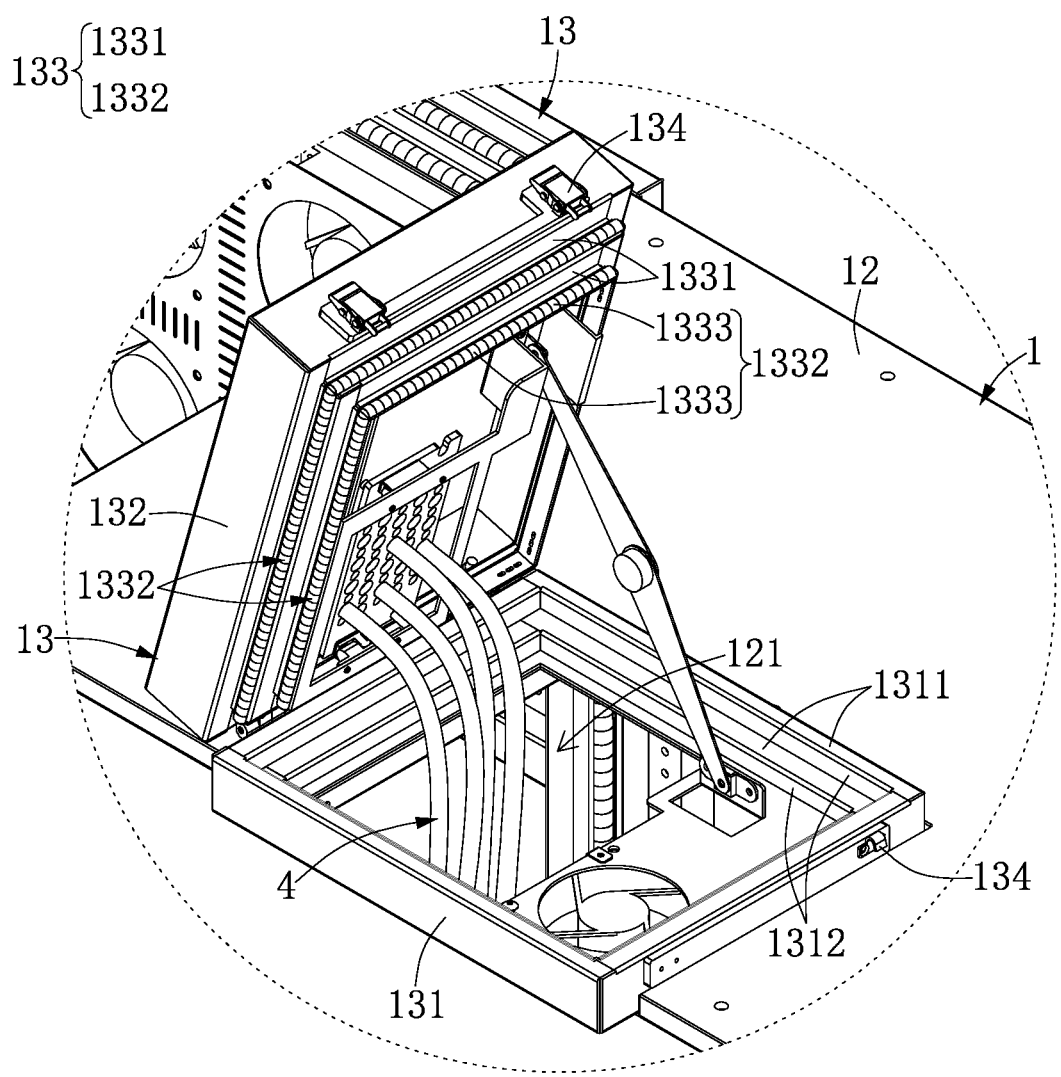
FIG. 7 is an enlarged view of a VII portion of FIG. 5 showing an electromagnetic shielding unit in a first configuration.
Figure 8:
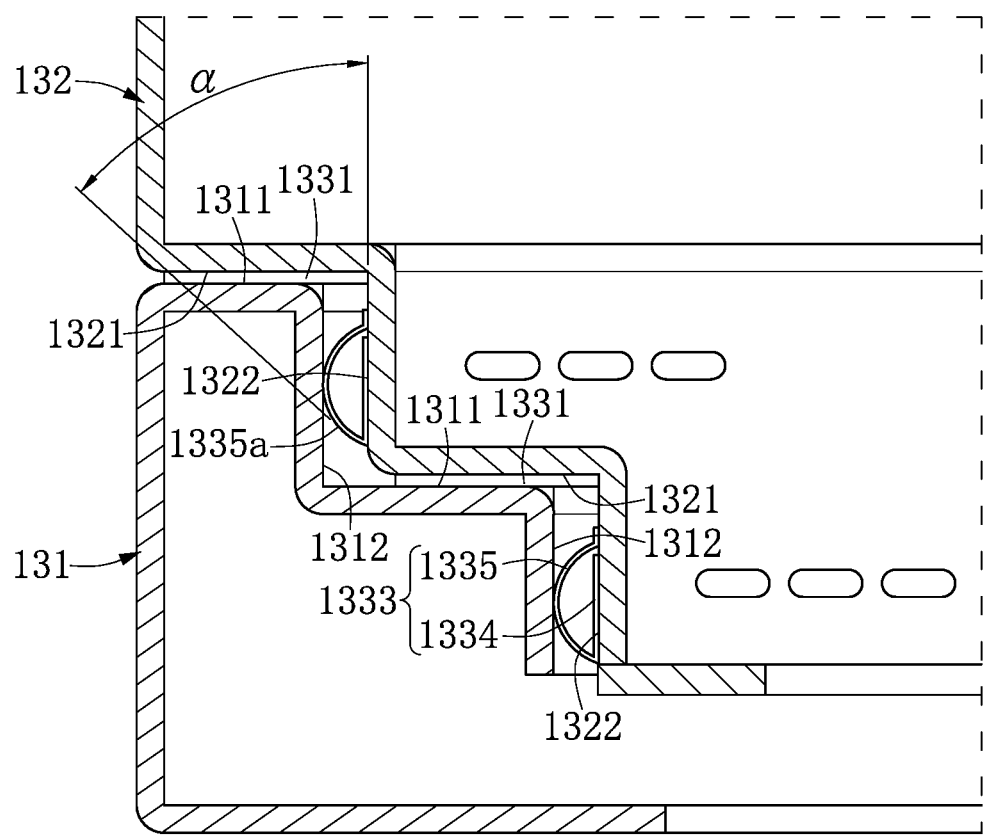
FIG. 8 is a cross-sectional view taken along a cross-sectional line VIII-VIII of FIG. 3.

As shown in FIG. 7 and FIG. 8, the electromagnetic shielding unit 13 in the present embodiment includes a stepped structure 131, a cover 132 detachably fastened to the stepped structure 131, a shielding structure 133 sandwiched between the stepped structure 131 and the cover 132, and two closing members 134 respectively fastened to the stepped structure 131 and the cover 132.

The stepped structure 131 includes a plurality of annular treads 1311 and a plurality of annular risers 1312 staggeredly arranged with the annular treads 1311. The annular treads 1311 are respectively and perpendicularly connected to the annular risers 1312, and the term "annular" in the present embodiment indicates square-ring shaped or rectangle-ring shaped, but the present disclosure is not limited thereto. Each of the number of the annular treads 1311 and the number of the annular risers 1312 in the present embodiment is two. In other words, the stepped structure 131 is provided with the annular riser 1312, the annular tread 1311, the annular riser 1312, and the annular tread 1311 that are perpendicularly connected in sequence from an inner side to an outer side of the stepped structure 131, but the present disclosure is not limited thereto.

As shown in FIG. 7 and FIG. 8, the cover 132 includes a plurality of abutting treads 1321 and a plurality of abutting risers 1322 staggeredly arranged with the abutting treads 1321. The abutting treads 1321 are respectively and perpendicularly connected to the abutting risers 1322, and each of the abutting treads 1321 is substantially perpendicular to a direction that is parallel to a central axis of the cover 132. Each of the abutting treads 1321 and the abutting risers 1322 is in an annular shape, and each of the number of the abutting treads 1321 and the number of the abutting risers 1322 in the present embodiment is two. In other words, the cover 132 is provided with the abutting riser 1322, the abutting tread 1321, the abutting riser 1322, and the abutting tread 1321 that are perpendicularly connected in sequence from an inner side to an outer side of the cover 132, but the present disclosure is not limited thereto.

Moreover, in the present embodiment, the abutting treads 1321 and the abutting risers 1322 of the cover 132 respectively correspond in shape and number to the annular treads 1311 and the annular risers 1312 of the stepped structure 131. The cover 132 in the present embodiment is pivotally connected to the stepped structure 131 (or the case 12), so that the abutting treads 1321 and the abutting risers 1322 of the cover 132 can move toward or away from the annular treads 1311 and the annular risers 1312 of the stepped structure 131. Specifically, the abutting treads 1321 of the cover 132 respectively face and are spaced apart from the annular treads 1311 of the stepped structure 131, and the abutting risers 1322 of the cover 132 respectively face and are spaced apart from the annular risers 1312 of the stepped structure 131.

As shown in FIG. 7 and FIG. 8, the shielding structure 133 includes a plurality of first isolation members 1331 and a plurality of second isolation members 1332 staggeredly arranged with the first isolation members 1331. Each of the abutting treads 1321 and the corresponding annular tread 1311 facing each other are configured to sandwich one of the first isolation members 1331, and a contacting region of each of the first isolation members 1331 with respect to the corresponding abutting tread 1321 and the corresponding annular tread 1311 each be in a closed annular shape. Each of the abutting risers 1322 and the corresponding annular riser 1312 facing each other are configured to sandwich one of the second isolation members 1332.

Figure 9:
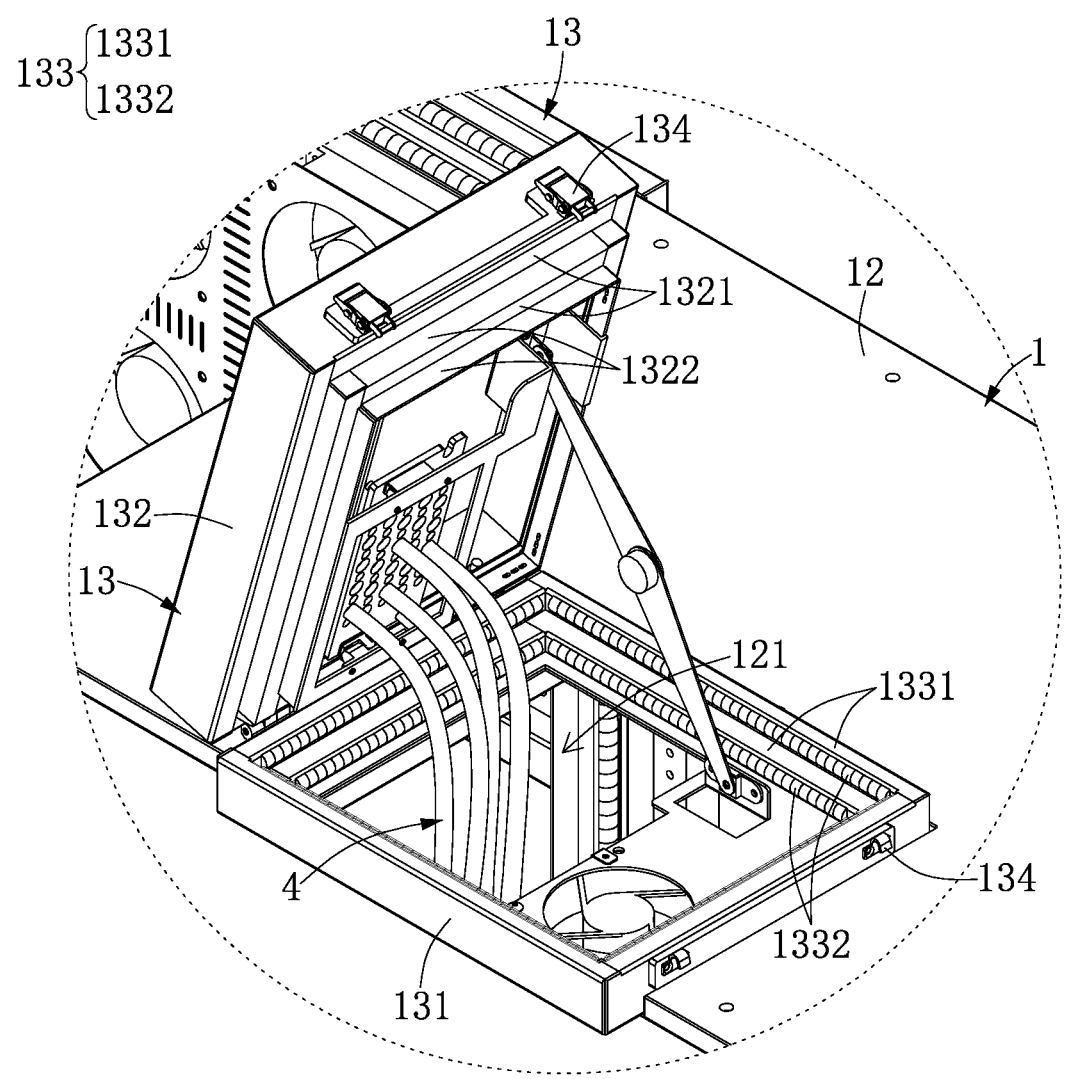
FIG. 9 is an enlarged view showing the electromagnetic shielding unit in a second configuration.
Figure 10:
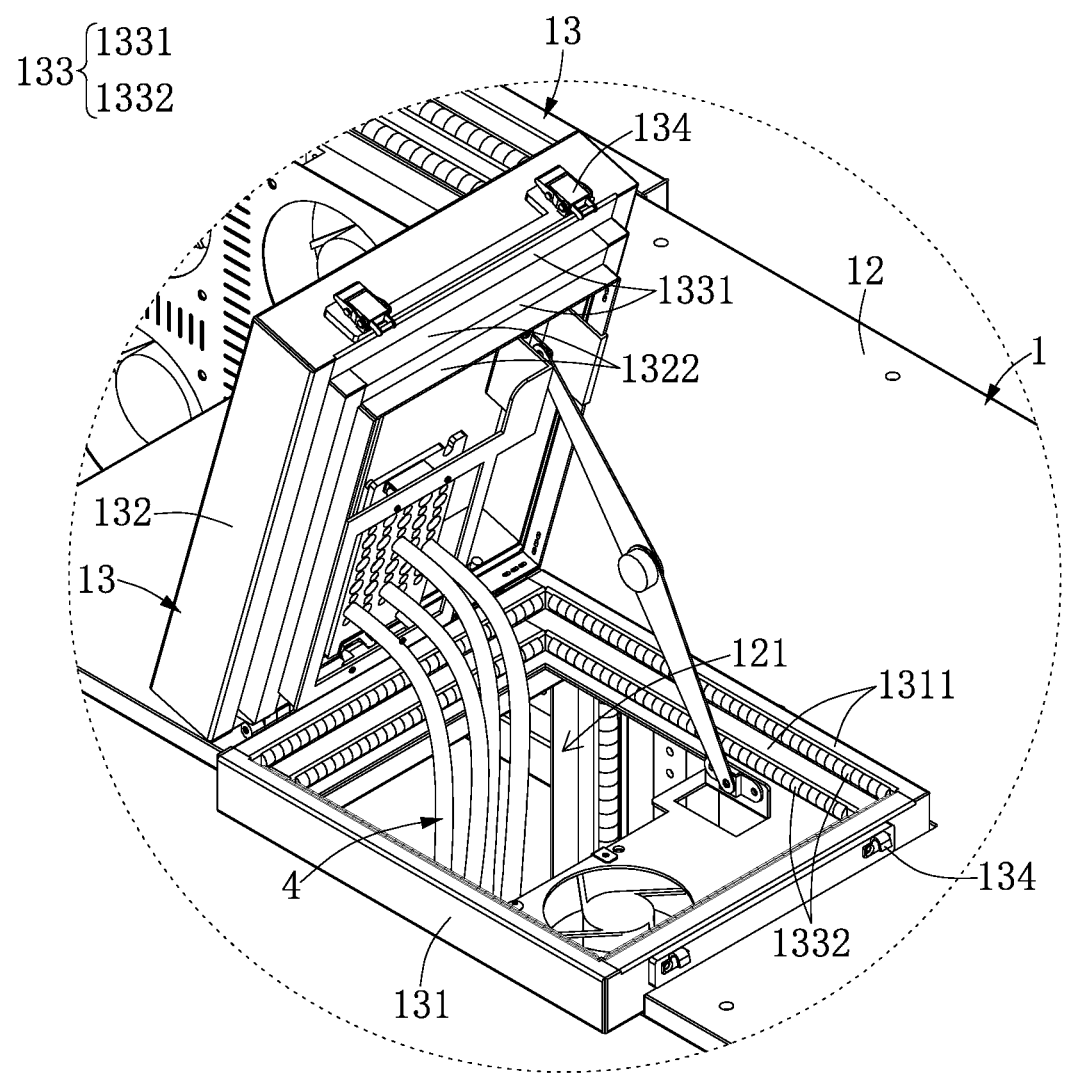
FIG. 10 is an enlarged view showing the electromagnetic shielding unit in a third configuration.

It should be noted that the first isolation members 1331 and the second isolation members 1332 of the shielding structure 133 as shown in FIG. 7 are respectively fixed on the abutting treads 1321 and the abutting risers 1322 of the cover 132, but the present disclosure is not limited thereto. For example, as shown in FIG. 9 and FIG. 10, each of the first isolation members 1331 can be fixed on the corresponding abutting tread 1321 or the corresponding annular tread 1311, and each of the second isolation members 1332 can be fixed on the corresponding abutting riser 1322 or the corresponding annular riser 1312.

Specifically, as shown in FIG. 7 and FIG. 8, each of the first isolation members 1331 in the present embodiment includes an electromagnetic shielding cloth being in an annular shape and having a metal material. For example, the electromagnetic shielding cloth can be formed by coating a metal layer on a cloth. The first isolation member 1331 is preferably a resiliently deformable structure. When the first isolation member 1331 is sandwiched (or compressed) between the corresponding abutting tread 1321 and the corresponding annular tread 1311, the contacting regions of the first isolation member 1331 with respect to the corresponding abutting tread 1321 and the corresponding annular tread 1311 each have a closed annular shape so as to achieve a better electromagnetic shielding performance.

Moreover, each of the second isolation members 1332 of the present embodiment includes a plurality of elastic metal sheets 1333 in an annular arrangement. The elastic metal sheet 1333 in the present embodiment is a substantially semicircular structure formed by bending an elongated metal strip. The elastic metal sheet 1333 includes a flat segment 1334 and an arc segment 1335. The flat segment 1334 is fixed on the abutting riser 1322 (or the annular riser 1312), an end of the arc segment 1335 is integrally connected to the flat segment 1334, and the other end of the arc segment 1335 is a free end, but the present disclosure is not limited thereto. Specifically, each of the elastic metal sheets 1333 preferably has a guiding surface 1335a (e.g., a part outer surface of the arc segment 1335), and the guiding surface 1335a of each of the elastic metal sheets 1333 and the corresponding abutting riser 1332 have an acute angle a there-between.

Moreover, when the cover 132 is fastened to the stepped structure 131, the arc segment 1335 (or the guiding surface 1335a) of each of the elastic metal sheets 1333 is compressed by the corresponding annular riser 1312 (or the corresponding abutting riser 1322), so that the arc segment 1335 is resiliently deformed toward the flat segment 1334 to store a returning force. Accordingly, the connection between the elastic metal sheet 1333 and the corresponding annular riser 1312 (or the corresponding abutting riser 1322) can be maintained by the returning force.

It should be noted that the predetermined electromagnetic shielding performance of the case module 1 is achieved by using the first isolation members 1331 and the second isolation members 1332 of the shielding structure 133 to cooperate with the corresponding components. In other words, a shielding structure including only one first isolation member and only one second isolation member does not identical to the shielding structure 133 of the present embodiment.

In addition, the specific structure of the first isolation member 1331 or the second isolation member 1332 can be adjusted or changed according to design requirements. For example, in other embodiments of the present disclosure, each of the first isolation member 1331 and the second isolation member 1332 can be an electromagnetic shielding cloth that is in an annular shape and has a metal material (e.g., the electromagnetic shielding cloth can be formed by coating a metal layer on a cloth).

Figure 11:
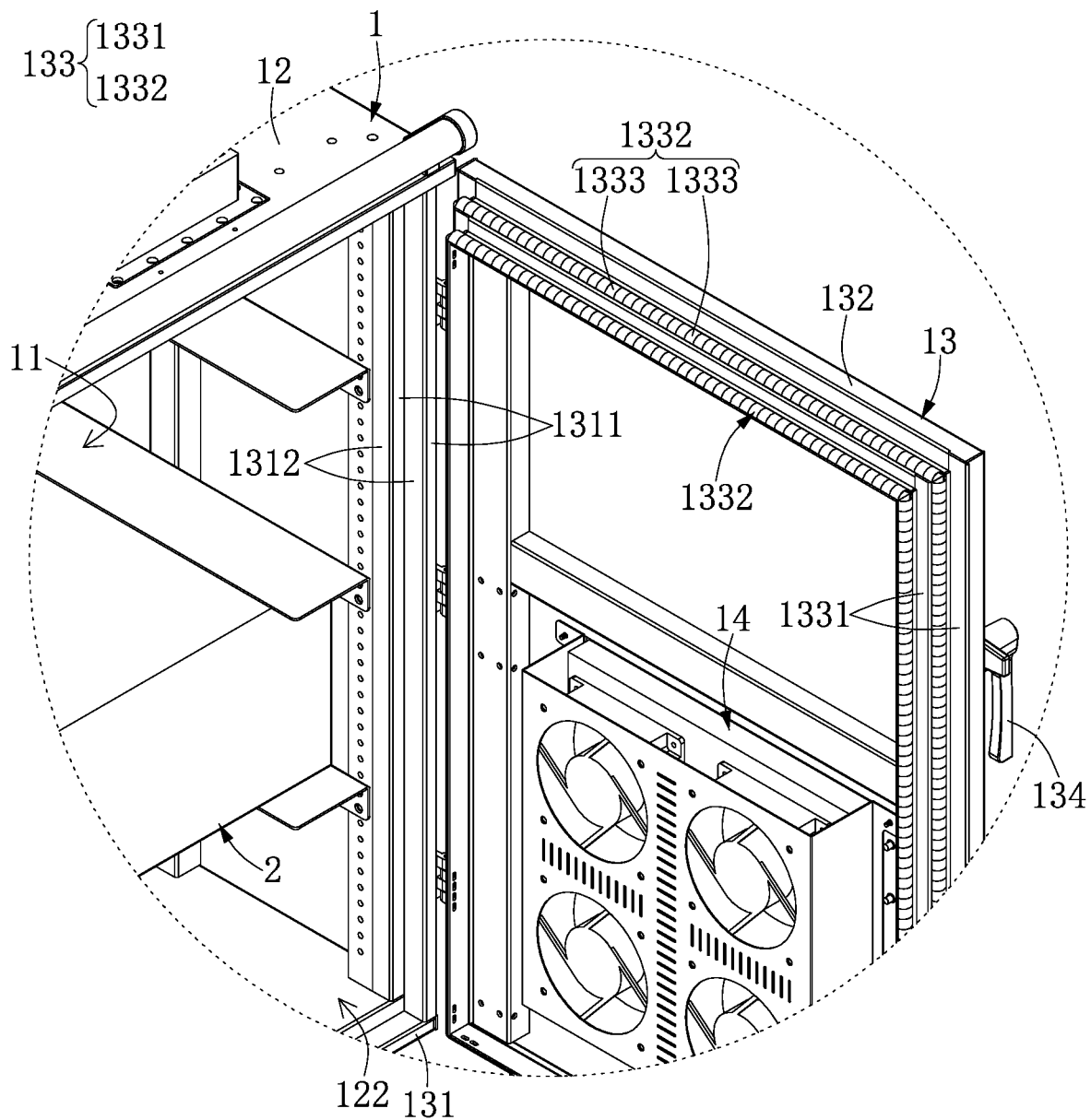
FIG. 11 is an enlarged view of a XI portion of FIG. 5.
Figure 12:
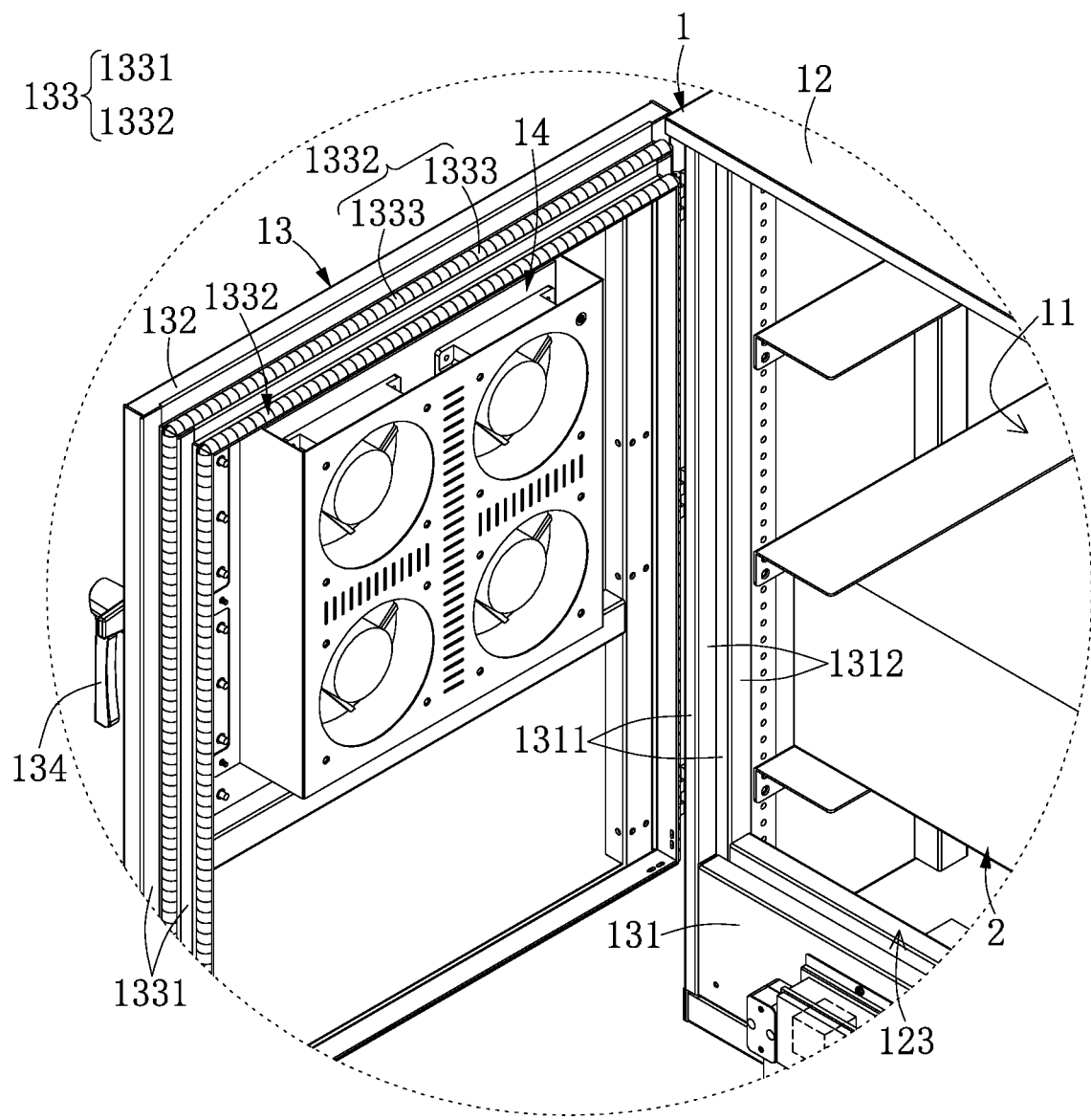
FIG. 12 is an enlarged view of a XII portion of FIG. 6.

As shown in FIG. 7, FIG. 11, and FIG. 12, the two closing members 134 of the present embodiment is a set of locking members, but the present disclosure is not limited thereto. When the two closing members 134 are interlocked with each other, each of the abutting treads 1321 and the corresponding annular tread 1311 facing each other are configured to sandwich one of the first isolation members 1331 by a first predetermined pressure, and each of the abutting risers 1322 and the corresponding annular riser 1312 facing each other are configured to sandwich one of the second isolation members 1332 by a second predetermined pressure. Moreover, the first predetermined pressure in the present embodiment can be equal to or different from the second predetermined pressure.

The above description discloses the structure of one of the electromagnetic shielding units 13, and the following description discloses the relationships between the electromagnetic shielding units 13 and the other components. As shown in FIG. 7, FIG. 11, and FIG. 12, the three electromagnetic shielding units 13 are respectively arranged to shield the cable hole 121, the front entrance 122, and the rear entrance 123, so that the case module 1 can block an external electromagnetic signal outside of the case module 1 from entering into the accommodating space 11 through at least one of the cable hole 121, the front entrance 122, and the rear entrance 123 by the three electromagnetic shielding units 13.

Specifically, the stepped structure 131 in the present embodiment can be fixed on the case 12 by soldering or can be integrally formed with the case 12, but the present disclosure is not limited thereto. The stepped structures 131 of the three electromagnetic shielding units 13 are respectively arranged around the cable hole 121, the front entrance 122, and the rear entrance 123. Moreover, the cable hole 121, the front entrance 122, and the rear entrance 123 can be respectively defined by the inner edges of the stepped structures 131 of the three electromagnetic shielding units 13.

Figure 3:
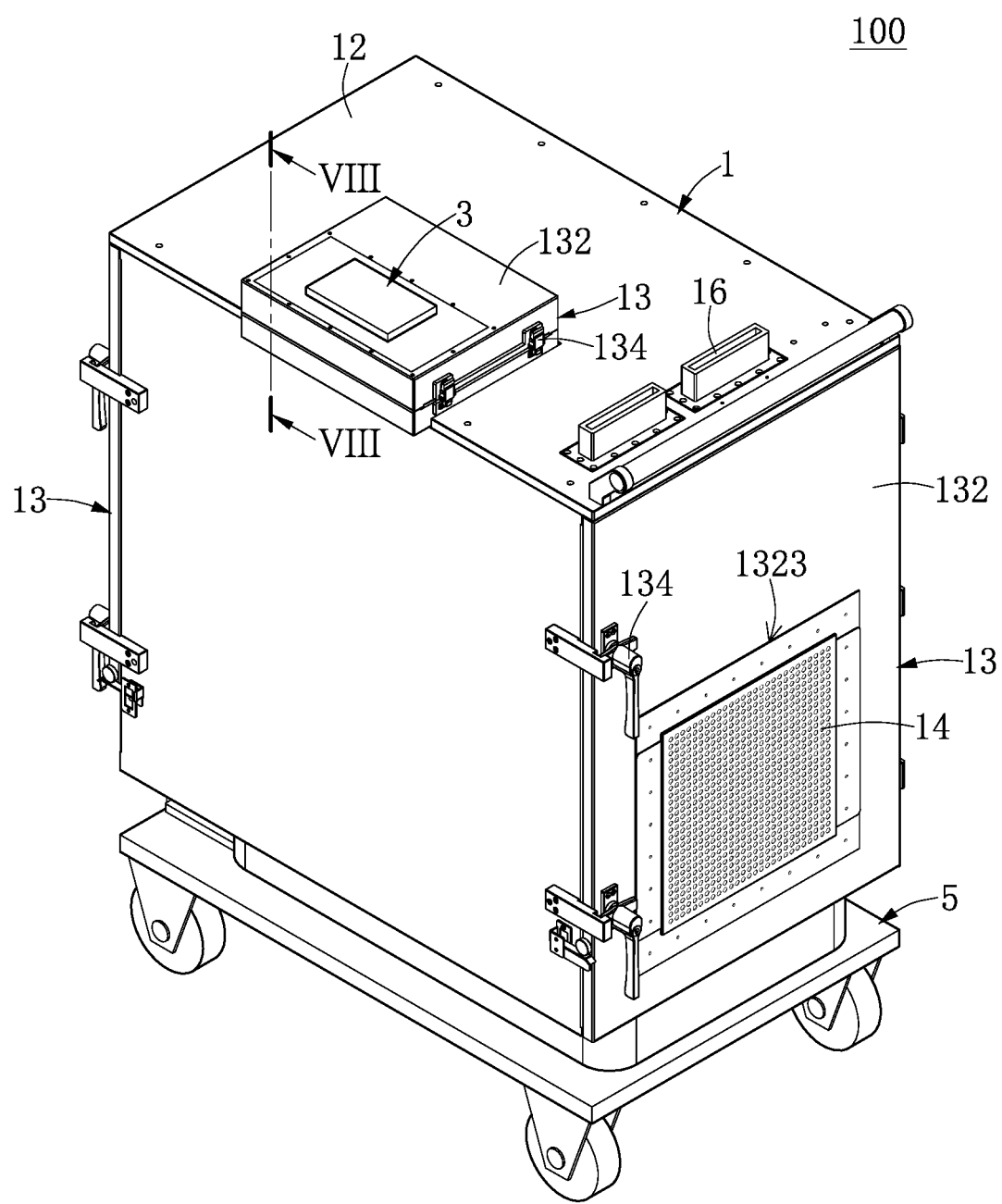
FIG. 3 is a perspective view of a movable testing device according to the embodiment of the present disclosure.
Figure 4:
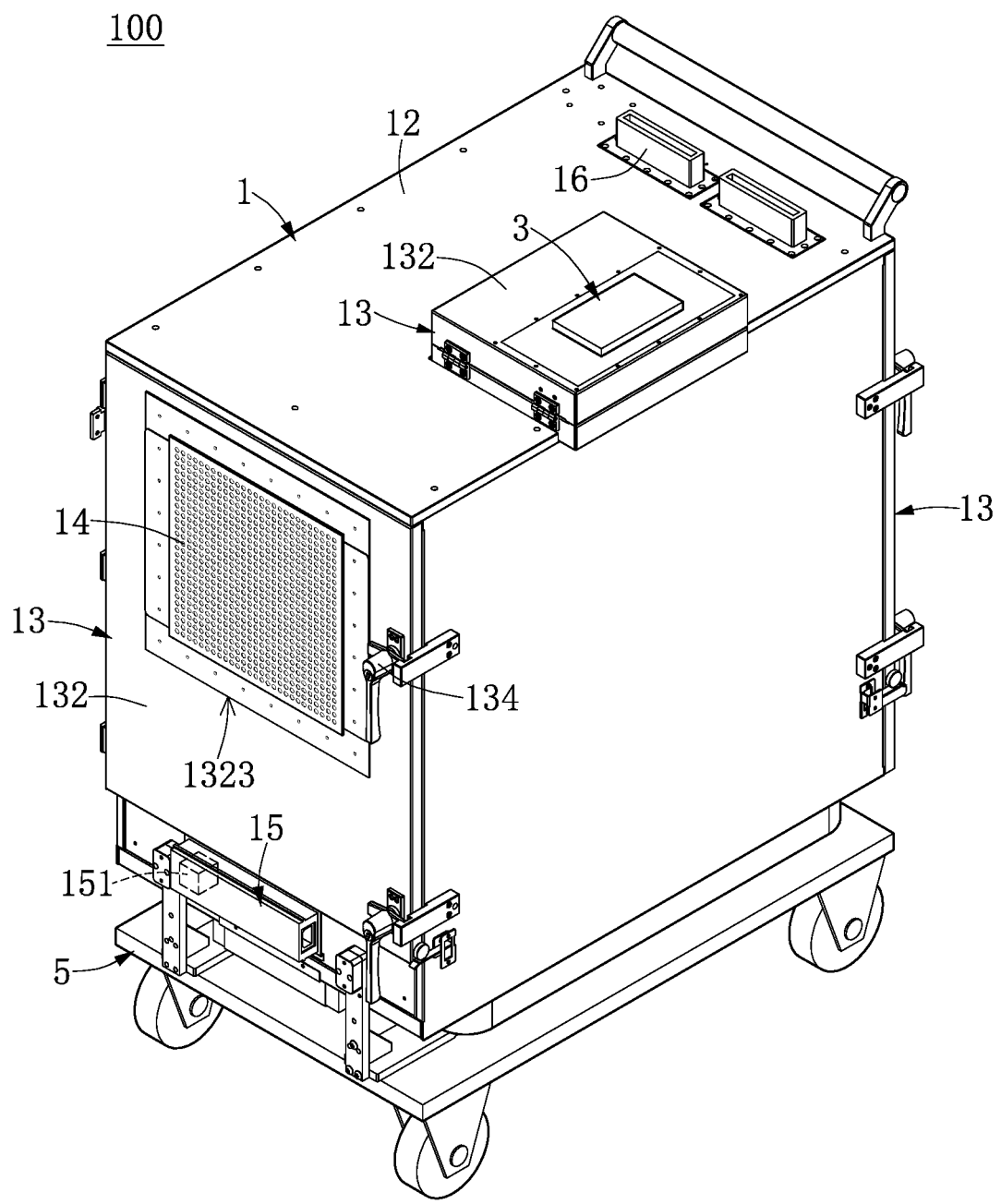
FIG. 4 is a perspective view showing the movable testing device of FIG. 3 from another angle of view.

In addition, two of the three electromagnetic shielding units 13 arranged to shield the front entrance 122 and the rear entrance 123 each have a heat-dissipating hole 1323 (as shown in FIG. 3 and FIG. 4) formed on the cover 132 thereof and in spatial-communication with the accommodating space 11, but the present disclosure is not limited thereto. For example, in other embodiments of the present disclosure, the case module 1 is provided without the rear entrance 123, and the electromagnetic shielding unit 13 arranged to shield the front entrance 122 has a heat-dissipating hole 1323 formed on the cover 132 thereof and in spatial-communication with the accommodating space 11.

Figure 13:
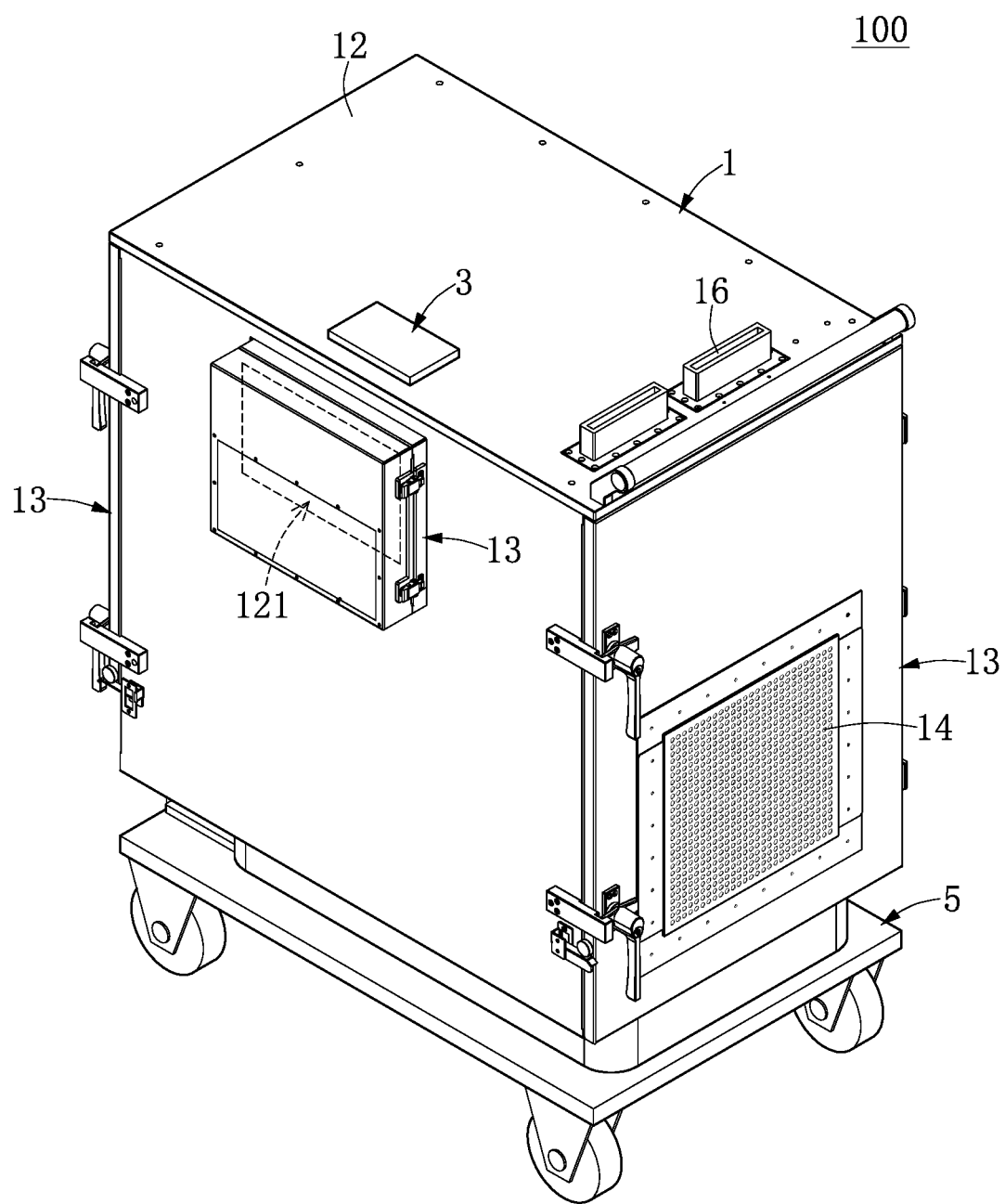
FIG. 13 is a perspective view of the movable testing device in another configuration.

Moreover, the cable hole 121 and the corresponding electromagnetic shielding unit 13 in the present embodiment can be adjusted or changed according to design requirements. For example, as shown in FIG. 13, the cable hole 121 and the corresponding electromagnetic shielding unit 13 can be arranged on a boarder side surface of the case module 1.

As shown in FIG. 3 and FIG. 4, the two honeycomb electromagnetic shielding members 14 are respectively wedged in the two heat dissipating holes 1323 of the case module 1 for blocking an external electromagnetic signal. That is to say, any external electromagnetic signal needs to travel through the honeycomb electromagnetic shielding members 14 before passing through the heat dissipating holes 1323. Thus, the honeycomb electromagnetic shielding members 14 are configured to block any external electromagnetic signal from entering into the accommodating space 11 through the heat dissipating holes 1323.

It should be noted that the case module 1 in the present embodiment is provided with two honeycomb electromagnetic shielding members 14 respectively wedged in two heat dissipating holes 1323, but the present disclosure is not limited thereto. For example, in other embodiments of the present disclosure, the case 12 can be formed with more than two heat dissipating holes 1323, and the case module 1 includes more than two honeycomb electromagnetic shielding members 14 respectively wedged in the heat dissipating holes 1323, so that air convention can be quickly formed in the accommodating space 11 of the case module 1 by the honeycomb electromagnetic shielding members 14. Moreover, each of the honeycomb electromagnetic shielding members 14 can be provided with a fan for enhancing air convention.

As shown in FIG. 1 and FIG. 4, the power supply 15 is installed on the case 12 for connecting to an external alternating current (AC) outlet (e.g., a mains outlet), so that the movable testing device 100 can be operated by acquiring electricity from the external AC outlet. Moreover, the power supply 15 has an AC filter 151, and the AC filter 151 is configured to block an external electromagnetic signal from entering into the accommodating space 11 through the power supply 15.

The external connector 16 is installed on a top portion of the case 12. Two opposite ends of the external transmitting cable 17 are respectively connected to the external connector 16 and the automatic testing platform 200 so as to establish an electrical connection between the movable testing device 100 and the automatic testing platform 200. The external connector 16 is configured to block an external electromagnetic signal from entering into the accommodating space 11.

As shown in FIG. 1 and FIG. 2, the RF analytical instrument 2 is detachably arranged in the accommodating space 11 of the case module 1 through the front entrance 122 or the rear entrance 123, and the RF analytical instrument 2 is electrically connected to the external connector 16 by using at least one cable (not shown). Moreover, two opposite ends of the external transmitting cable 17 are respectively connected to the external connector 16 and the automatic testing platform 200 so as to establish an electrical connection between the RF analytical instrument 2 and the automatic testing platform 200.

As shown in FIG. 1, FIG. 3, and FIG. 6, the testing socket 3 is installed on the top portion of the case module 1 and is exposed from the case module 1 for providing an insertion and an electrical connection to the DUT P. The testing socket 3 in the present embodiment is disposed on the cover 132 of the electromagnetic shielding unit 13 corresponding in position to the cable hole 121, but the present disclosure is not limited thereto.

The internal transmitting cables 4 are arranged in the accommodating space 11 of the case module 1. An end of each of the internal transmitting cables 4 (e.g., a top end of the internal transmitting cable 4 as shown in FIG. 1) is connected to the testing socket 3, and the other end of each of the internal transmitting cables 4 (e.g., a bottom end of the internal transmitting cable 4 as shown in FIG. 1) is connected to the RF analytical instrument 2, thereby electrically connecting the testing socket 3 and the DUT P inserted into the testing socket 3 to the RF analytical instrument 2.

Thus, when the DUT P is arranged in and is tested by the automatic testing platform 200, the RF analytical instrument 2 can be used to analyze the testing data of the DUT P by electrically connecting the DUT P to the automatic testing platform 200. Moreover, the cable hole 121 is arranged adjacent to the testing socket 3 and corresponds in position to the internal transmitting cables 4 (e.g., the top end of the internal transmitting cable 4 as shown in FIG. 1), so that the inner components (e.g., the internal transmitting cables 4) arranged in the case module 1 can be organized through the cable hole 121.

In summary, the movable testing device 100 of the present embodiment blocks an external electromagnetic signal outside of the movable testing device 100 from entering into the accommodating space 11 by the electromagnetic shielding units 13, the honeycomb electromagnetic shielding members 14, the power supply 15, and the external connector 16. Moreover, the isolation of the conventional RF testing apparatus related to an external electromagnetic signal is lower than 60 dB, but the movable testing device 100 of the present embodiment has an isolation of 90 dB related to an external electromagnetic signal.

In conclusion, the case module 1, the movable testing device 100, and the RF testing apparatus 1000 of the present disclosure each can be provided with a cable hole 121 (that is preferably arranged corresponding in position to the testing socket and the internal transmitting cables), so that the inner components (e.g., the internal transmitting cables 4) arranged in the case module 1 can be organized through the cable hole 121. Moreover, the cable hole 121 and the front entrance 122 of the cable module 1 each can be shielded (or sealed) by one electromagnetic shielding unit 13, and an external electromagnetic signal outside of the movable testing device 100 (or the case module 1) can be blocked from entering into the accommodating space 11 through the cable hole 121 and the front entrance 122, so that the forming of the cable hole 121 does not affect the electromagnetic shielding performance.

Furthermore, the movable testing device 100 of the present disclosure can be moved toward the automatic testing platform 200 so that the testing socket 3 is under the insert hole 202, and the lift mechanism 5 can be operated to move the case module 1 for moving the testing socket 3 to accurately enter into the testing space 201 through the insert hole 202, thereby effectively increasing the testing efficiency of the RF testing apparatus 1000.

In addition, in order to block any external electromagnetic signal from entering into the accommodating space 11, the movable testing device 100 having the electromagnetic shielding units 13 further includes the honeycomb electromagnetic shielding members 14, the power supply 15 having the AC filter 151, and the external connector 16. Accordingly, the movable testing device 100 of the present disclosure can be provided with an isolation of 90 dB related to an external electromagnetic signal.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A case module of a radiofrequency (RF) testing apparatus, comprising: at least two electromagnetic shielding units, wherein the RF testing apparatus has an accommodating space arranged inside thereof, a cable hole, and a front entrance, and the cable hole and the front entrance are in spatial-communication with the accommodating space, wherein the at least two electromagnetic shielding units respectively cover the cable hole and the front entrance, and each of the at least two electromagnetic shielding units includes:
    a stepped structure including a plurality of annular treads and a plurality of annular risers staggeredly arranged with the annular treads;
    a cover detachably fastened to the stepped structure and including a plurality of abutting treads and a plurality of abutting risers staggeredly arranged with the abutting treads, wherein the abutting treads respectively face and are spaced apart from the annular treads, and the abutting risers respectively face and are spaced apart from the annular risers; and
    a shielding structure including a plurality of first isolation members and a plurality of second isolation members staggeredly arranged with the first isolation members, wherein each of the abutting treads and the corresponding annular tread facing each other are configured to sandwich one of the first isolation members, and contacting regions of each of the first isolation members with respect to the corresponding abutting tread and the corresponding annular tread each have a closed annular shape, and wherein each of the abutting risers and the corresponding annular riser facing each other are configured to sandwich one of the second isolation members,
    wherein the stepped structures of the at least two electromagnetic shielding units are respectively arranged around the cable hole and the front entrance.

2. The case module according to claim 1, wherein in each of the at least two electromagnetic shielding units, each of the first isolation members includes an electromagnetic shielding cloth being in an annular shape and having a metal material, and each of the second isolation members includes a plurality of elastic metal sheets in an annular arrangement.

3. The case module according to claim 2, wherein in each of the at least two electromagnetic shielding units, each of the abutting treads is substantially perpendicular to a direction parallel to a central axis of the cover, and the abutting treads respectively and perpendicularly connected to the abutting risers; each of the elastic metal sheets has a guiding surface, and the guiding surface of each of the elastic metal sheets and the corresponding abutting riser have an acute angle there-between.

4. The case module according to claim 1, wherein each of the at least two electromagnetic shielding units includes two closing members respectively fastened to the stepped structure and the cover thereof; in each of the at least two electromagnetic shielding units, when the two closing members are interlocked with each other, each of the abutting treads and the corresponding annular tread facing each other are configured to sandwich one of the first isolation members by a first predetermined pressure, and each of the abutting risers and the corresponding annular riser facing each other are configured to sandwich one of the second isolation members by a second predetermined pressure.

5. The case module according to claim 1, wherein in each of the at least two electromagnetic shielding units, each of the first isolation members is fixed on the corresponding abutting tread or the corresponding annular tread, and each of the second isolation members is fixed on the corresponding abutting riser or the corresponding annular riser.

6. The case module according to claim 1, wherein the at least two electromagnetic shielding units are configured to block an external electromagnetic signal outside of the case module from entering into the accommodating space through the cable hole and the front entrance.

7. The case module according to claim 1, wherein one of the at least two electromagnetic shielding units arranged to cover the front entrance has a heat-dissipating hole formed on the cover thereof and in spatial-communication with the accommodating space; the case module includes:
    a case formed with the cable hole and the front entrance;
    a honeycomb electromagnetic shielding member wedged in the dissipating hole;
    a power supply fastened to the case for connecting to an external alternating current (AC) outlet, wherein the power supply has an AC filter;
    an external connector fastened to the case for being electrically connected to an RF analytical instrument; and
    an external transmitting cable having a first end connected to the external connector and an opposite second end for being connected to an automatic testing platform,
    wherein the case module blocks an external electromagnetic signal outside of the case module from entering into the accommodating space by the at least two electromagnetic shielding units, the honeycomb electromagnetic shielding member, the power supply, and the external connector.

8. The case module according to claim 1, wherein the case module has a rear entrance in spatial-communication with the accommodating space, the number of the at least two electromagnetic shielding units is limited to three, and the electromagnetic shielding units respectively cover the cable hole, the front entrance, and the rear entrance.

9. A movable testing device of an RF testing apparatus, comprising:

a case module having an accommodating space arranged inside thereof, a cable hole, and a front entrance, wherein the cable hole and the front entrance are in spatial-communication with the accommodating space, the case module includes at least two electromagnetic shielding units respectively covering the cable hole and the front entrance, and each of the at least two electromagnetic shielding units includes:
  a stepped structure including a plurality of annular treads and a plurality of annular risers staggeredly arranged with the annular treads;
  a cover detachably fastened to the stepped structure and including a plurality of abutting treads and a plurality of abutting risers staggeredly arranged with the abutting treads, wherein the abutting treads respectively face and are spaced apart from the annular treads, and the abutting risers respectively face and are spaced apart from the annular risers; and
  a shielding structure including a plurality of first isolation members and a plurality of second isolation members staggeredly arranged with the first isolation members, wherein each of the abutting treads and the corresponding annular tread facing each other are configured to sandwich one of the first isolation members, and contacting regions of each of the first isolation members with respect to the corresponding abutting tread and the corresponding annular tread each have a closed annular shape, and wherein each of the abutting risers and the corresponding annular riser facing each other are configured to sandwich one of the second isolation members,
  wherein the stepped structures of the at least two electromagnetic shielding units are respectively arranged around the cable hole and the front entrance;
an RF analytical instrument detachably arranged in the accommodating space of the case module by passing through the front entrance;
a testing socket disposed on a top portion of the case module and exposed from the case module for providing an insertion and an electrical connection to a device under test (DUT) to be tested; and
a plurality of internal transmitting cables arranged in the accommodating space, wherein at least one of the internal transmitting cables has two opposite ends respectively connected to the testing socket and the RF analytical instrument.

10. An RF testing apparatus, comprising:
an automatic testing platform having a testing space and an insert hole in spatial-communication with the testing space; and
a movable testing device including:
  a case module having an accommodating space arranged inside thereof, a cable hole, and a front entrance, wherein the cable hole and the front entrance are in spatial-communication with the accommodating space, the case module includes at least two electromagnetic shielding units respectively covering the cable hole and the front entrance, and each of the at least two electromagnetic shielding units includes:
    a stepped structure including a plurality of annular treads and a plurality of annular risers staggeredly arranged with the annular treads;
    a cover detachably fastened to the stepped structure and including a plurality of abutting treads and a plurality of abutting risers staggeredly arranged with the abutting treads, wherein the abutting treads respectively face and are spaced apart from the annular treads, and the abutting risers respectively face and are spaced apart from the annular risers; and
    a shielding structure including a plurality of first isolation members and a plurality of second isolation members staggeredly arranged with the first isolation members, wherein each of the abutting treads and the corresponding annular tread facing each other are configured to sandwich one of the first isolation members, and contacting regions of each of the first isolation members with respect to the corresponding abutting tread and the corresponding annular tread each have a closed annular shape, and wherein each of the abutting risers and the corresponding annular riser facing each other are configured to sandwich one of the second isolation members,
  wherein the stepped structures of the at least two electromagnetic shielding units are respectively arranged around the cable hole and the front entrance;
  an RF analytical instrument detachably arranged in the accommodating space of the case module by passing through the front entrance;
  a testing socket disposed on a top portion of the case module and exposed from the case module for providing an insertion and an electrical connection to a DUT to be tested;
  a plurality of internal transmitting cables arranged in the accommodating space, wherein at least one of the internal transmitting cables has two opposite ends respectively connected to the testing socket and the RF analytical instrument, and the cable hole is arranged adjacent to the testing socket and corresponds in position to the internal transmitting cables; and
  a lift mechanism fastened to a bottom portion of the case module and configured to raise or lower the case module,
wherein when the movable testing device is moved toward the automatic testing platform so that the testing socket is under the insert hole, the lift mechanism is configured to move the case module for moving the testing socket to enter into the testing space through the insert hole.

* * * * *